(12) United States Patent
Strzalkowski

(10) Patent No.: US 7,605,580 B2
(45) Date of Patent: Oct. 20, 2009

(54) INTEGRATED HYBRID CURRENT SENSOR

(75) Inventor: Bernhard Strzalkowski, Munich (DE)

(73) Assignee: Infineon Technologies Austria AG, Villach (AT)

( * ) Notice: Subject to any disclaimer, the term of this patent is extended or adjusted under 35 U.S.C. 154(b) by 25 days.

(21) Appl. No.: 11/771,652

(22) Filed: Jun. 29, 2007

(65) Prior Publication Data

US 2009/0001964 A1 Jan. 1, 2009

(51) Int. Cl.
 *G01R 15/20* (2006.01)
 *G01R 19/15* (2006.01)
(52) U.S. Cl. .............................. 324/117 H; 324/117 R
(58) Field of Classification Search .................. None
 See application file for complete search history.

(56) References Cited

U.S. PATENT DOCUMENTS

| | | | | |
|---|---|---|---|---|
| 4,200,814 A | * | 4/1980 | Tanaka et al. ................ 327/358 |
| 4,596,950 A | * | 6/1986 | Lienhard et al. ......... 324/117 R |
| 4,881,031 A | * | 11/1989 | Pfisterer et al. .............. 324/233 |
| 5,049,809 A | * | 9/1991 | Wakatsuki et al. ...... 324/117 R |
| 5,200,701 A | * | 4/1993 | Siebold et al. .............. 324/309 |
| 5,493,211 A | * | 2/1996 | Baker ......................... 324/130 |
| 5,831,431 A | * | 11/1998 | Gottfried-Gottfried et al. ............................ 324/239 |
| 6,366,076 B1 | * | 4/2002 | Karrer et al. ............. 324/117 R |
| 6,429,651 B1 | * | 8/2002 | Choi et al. .................... 324/249 |
| 6,593,841 B1 | * | 7/2003 | Mizoguchi et al. .......... 336/200 |
| 6,690,164 B1 | * | 2/2004 | Fedeli et al. ................. 324/253 |
| 6,861,838 B2 | * | 3/2005 | Kawase ....................... 324/249 |
| 6,879,145 B1 | * | 4/2005 | Harris ...................... 324/158.1 |
| 6,927,662 B2 | * | 8/2005 | Kahlmann et al. ........... 336/200 |
| 7,015,691 B2 | * | 3/2006 | Kang et al. .................. 324/253 |
| 2004/0056749 A1 | * | 3/2004 | Kahlmann et al. ........... 336/200 |
| 2006/0028313 A1 | * | 2/2006 | Strzalkowski et al. ........ 336/223 |

FOREIGN PATENT DOCUMENTS

| DE | 2621302 A | * | 12/1976 |
|---|---|---|---|
| DE | 10100282 A1 | * | 7/2002 |

* cited by examiner

*Primary Examiner*—Paresh Patel
(74) *Attorney, Agent, or Firm*—Slater & Matsil, L.L.P.

(57) ABSTRACT

A sensor arrangement for measuring current is disclosed. The sensor arrangement includes a substrate, at least one Hall element integrated in or arranged on the substrate, a first coil that is spaced apart from a surface of the substrate in a vertical direction, a second coil that is spaced apart in a vertical direction from the first coil, and an isolation layer that is arranged between the first coil and the second coil.

27 Claims, 3 Drawing Sheets

(view A-A)

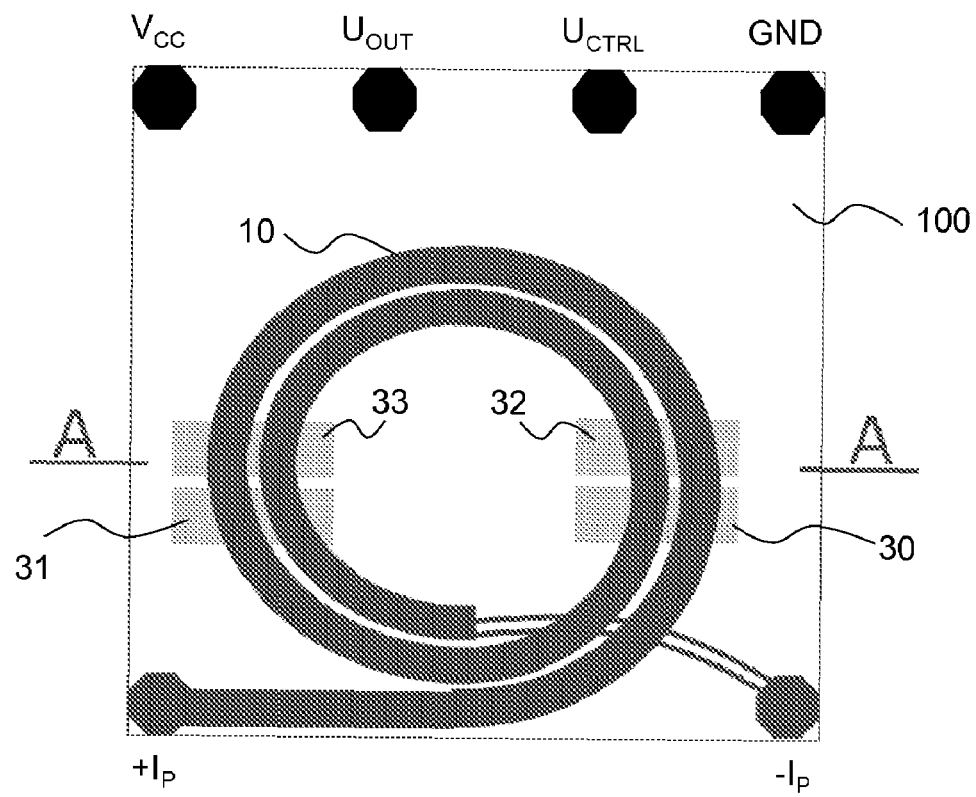
*Fig. 2*
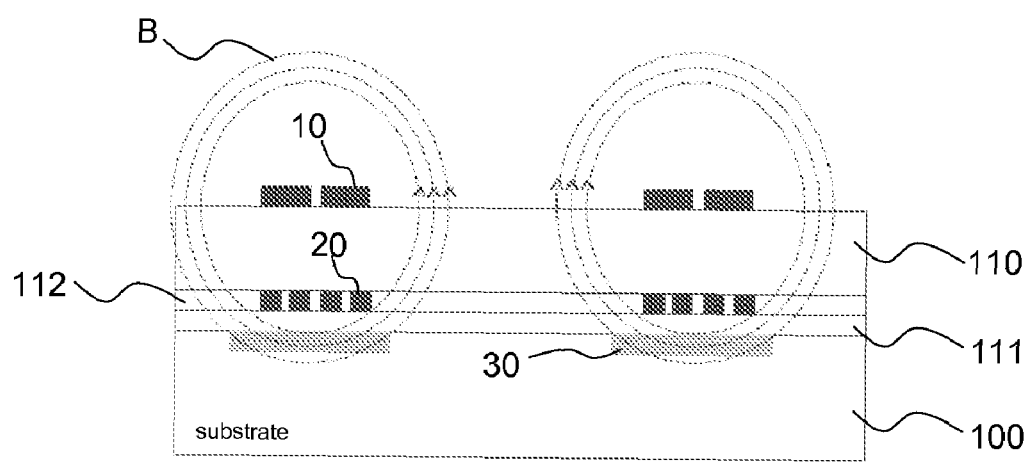
*Fig. 3* (view A-A)

INTEGRATED HYBRID CURRENT SENSOR

TECHNICAL FIELD

The invention relates to the field of integrated current sensors having a potential separation.

BACKGROUND

Potential separated current sensors are widespread in power electronics, medical engineering, etc. Considering multiple-purpose current sensors, it is desirable, that current can be measured in a broad frequency range including direct current (DC). Hall sensors, which are arranged in a gap of a toroidal magnetic core, are often used as current sensors in a frequency range from 0 to approximately 50 kHz. Such current sensors often require magnetic field concentrators that are arranged in a voluminous package together with the current sensor. Such sensor arrangements are expensive and cumbersome to manufacture, so that there is a need for potential separated current sensors which on the one hand are small in their geometric dimensions and inexpensive to manufacture, and on the other hand allow for a current measurement in a very broad frequency range.

SUMMARY OF THE INVENTION

One aspect of the invention relates to a measurement circuit for a potential separated current measurement that includes: a primary winding for carrying a primary current generating a magnetic field, a secondary winding that is magnetically coupled with the primary winding and provides a first signal dependent on the primary current, a Hall sensor that is arranged such that it is pervaded by the magnetic field of the primary current for providing a second signal depending on the primary current, and an evaluation circuit for determining a measurement signal representing the primary current from a first signal and a second signal.

Another aspect of the invention relates to a sensor arrangement that includes a substrate, at least one Hall element integrated in or arranged on the substrate, a first coil which is spaced apart from a surface of the substrate in a vertical direction, a second coil that is spaced apart in a vertical direction from the first coil, and an isolation layer that is arranged between the first coil and the second coil.

According to one example of the invention, the aforementioned evaluation circuit comprises a low-pass receiving the first signal and providing a third signal, the third signal being a low-pass filtered version of the first signal, and an adder for a weighted addition of the second and the third signal, the adder providing a measurement signal dependent on the weighted sum.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 2 shows the top view of a sensor arrangement corresponding to the measurement circuit of FIG. 1. The sensor arrangement having a substrate with Hall elements integrated therein and a first and a second planar coil;

FIG. 3 shows the sensor arrangement of FIG. 2 in a cross sectional view; and

DETAILED DESCRIPTION OF ILLUSTRATIVE EMBODIMENTS

Hall sensors can achieve very good properties in terms of offset and temperature stability, if they are connected to circuits that are suitable for compensating offset and temperature drifts. However, the bandwidth of Hall elements is too low for many applications. The behavior of Hall sensors can be described approximately by a transfer function of a first-order low-pass. The combination of Hall elements with a planar transformer having planar primary and secondary windings allows for the construction of a novel current sensor, which on the one hand has the desirable DC-properties of a Hall sensor, and on the other hand has a cut of frequency much higher than common current sensors using Hall elements. Furthermore planar coreless transformer windings can be integrated on a semiconductor chip.

Figure 1:
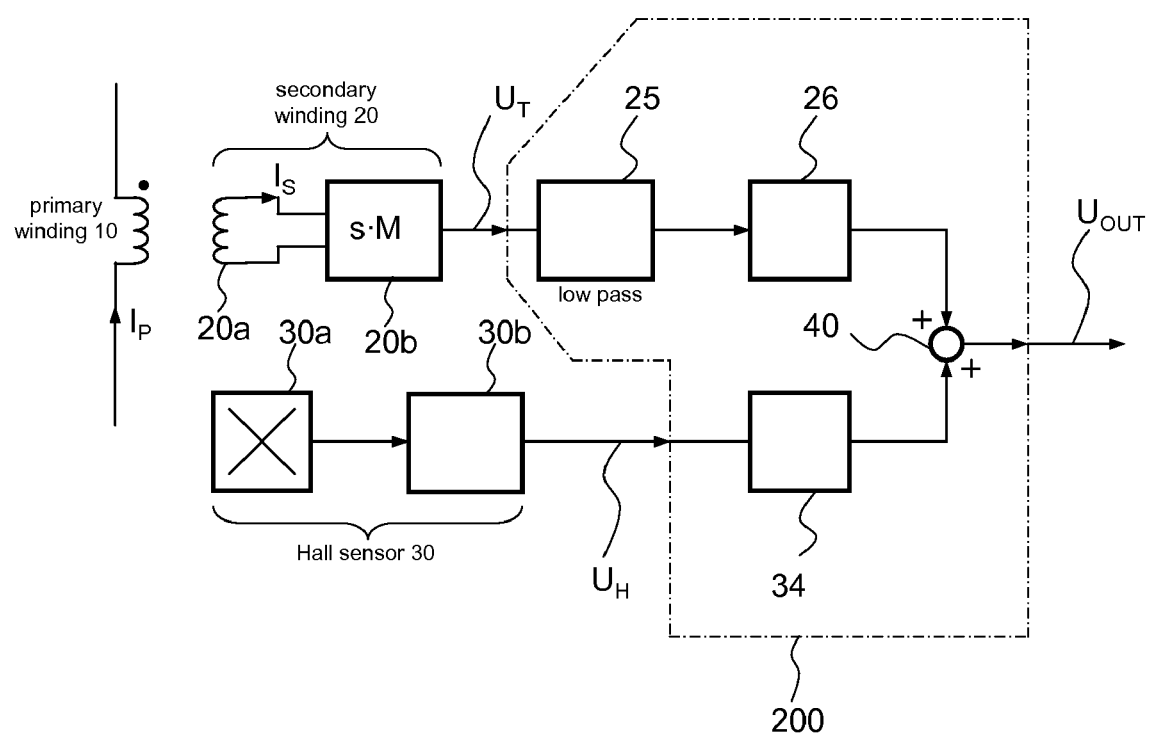
FIG. 1 shows as a first example of the invention a measurement circuit for potential separated current measurement with a Hall sensor, a primary winding, and a secondary winding.

FIG. 1 shows a block diagram of first example of the invention. The measurement circuit depicted in FIG. 1 comprises a transformer with a primary winding 10 and a secondary winding 20, wherein the primary winding 10 carries the current (measurement current $I_P$) to be measured. The secondary winding 20 is magnetically coupled with the primary winding 10 and provides a first signal $U_T$ dependent on the measurement current $I_P$, wherein the first signal $U_T$ represents the voltage induced in the secondary winding 20. According to Faraday's Law the measurement current $I_P$ and the first signal $U_T$ are related as shown by the following equation in the time domain:

$$U_T = M \cdot di_P/dt \qquad (1)$$

In the Laplace-domain (i.e., in the frequency domain) the above equation (1) yields:

$$U_T(s) = s \cdot M \cdot i_P(s) \qquad (2)$$

The reference symbol M denotes the mutual inductance of the primary winding 10 and the secondary winding 20, the expression $di_P/dt$ the first derivation of the measurement current $I_P$ with respect to time t, $U_T(s)$ the Laplace transformed first signal $U_T$, $I_P(s)$ the Laplace transformed measurement current $I_P$. The variable s denotes the generally complex Laplace-variable.

The secondary winding 20 provides—according to Faraday's Law—as a first signal $U_T$ a voltage which is proportional to the first derivation of the measurement current through the primary winding, wherein the constant of proportionality corresponds to the mutual inductance M. This differentiating behavior is expressed in the model of FIG. 1 by means of a differentiator 20b connected downstream to the secondary winding 20a which carries a secondary current $I_S$. The differentiator 20b provides the first signal $U_T$. The coil 20a and the differentiator 20b are not separate components but only represent by means of a model the behavior of the secondary winding 20.

The secondary winding 20 is connected to a low-pass 25, which receives the first signal $U_T$. The output signal of the low-pass 25 is denoted as "third signal" $U_T{'}$ which is a low-pass-filtered version of the first signal $U_T$. The transfer function of the low-pass 25 can be, for example, written as follows:

$$U'_T(s) = \frac{1}{1+s \cdot T_{TP}} U_T(s). \quad (3)$$

The symbol $U_T'(s)$ denotes the Laplace transformed third signal $U_T$. The equation (3) describes a first-order low-pass having a time constant $T_{TP}$.

The block diagram further comprises a Hall sensor 30, providing a second signal $U_H$ being dependent on the measurement current $I_P$. As already mentioned, Hall sensors can have a rather low bandwidth. However, the behavior of the Hall sensor 30 may be described by a sensor element 30a which supplies a signal proportional to the measurement current $I_P$ (primary current) to a low-pass 30b. The output signal of the low-pass 30b then corresponds to the actual output voltage of the Hall sensor 30. In the following this output voltage is denoted as second signal $U_H$. The relation between the second signal $U_H$ and the measurement current $I_P$ can be written as follows:

$$U_H(s) = \frac{K_H}{1+s \cdot T_H} I_P(s). \quad (4)$$

The expression $U_H(s)$ denotes the Laplace transformed second signal $U_H$ (i.e., the output voltage of the Hall sensor 30), the expression $K_H$ denotes the Hall constant, i.e., the constant of proportionality between the measurement current $I_P$ and the second signal $U_H$ in the case of direct current. The transfer function of equation (4) also has a low-pass characteristic, wherein the low-pass 30b of the Hall sensor 30 has a time constant $T_H$. As it will be become apparent below, the time constant $T_{TP}$ of the low-pass 25 should be chosen such that it is approximately equal to the time constant $T_H$ of the low-pass 30b of the Hall sensor 30 ($T_{TP}=T_H$).

By means of the weight-factors 26 and 34 and the adder 40 a weighted addition of the second signal $U_H$ and the third signal $U_T'$ is performed. The weighted sum is the output signal $U_{out}$ of the measurement circuit. The weight-factor 26 is in the present example $T_H K_{ADJ}/M$ and the weight-factor 34 is $K_{ADJ}/K_H$. The weighted sum $U_{OUT}$ is in the present example defined as follows:

$$U_{OUT} = \frac{T_H \cdot K_{ADJ}}{M} U_T' + \frac{K_{ADJ}}{K_H} U_H. \quad (5)$$

By substituting equations (3) and (4) into equation (5) the following expression can be obtained for the Laplace transformed of the output voltage $U_{OUT}(s)$ for identical time constants $T_{TP}=T_H$:

$$U_{OUT}(s) = \left[ s \cdot M \left( \frac{1}{1+s \cdot T_H} \cdot \frac{T_H K_{ADJ}}{M} \right) + \frac{K_H}{1+s \cdot T_H} \cdot \frac{K_{ADJ}}{K_H} \right] I_P(s) \quad (6)$$

$$= K_{ADJ} \cdot I_P(s).$$

It can be seen from equation (6), that a frequency independent relation between the output signal $U_{OUT}$ and the measurement current $I_P$ can be obtained by combining the second signal $U_H$ of the Hall sensor 30 and the third signal $U_T'$ derived from the output signal of the secondary winding 20. The measurement circuit of FIG. 1 allows for a current measurement with a bandwidth much larger than it would be possible with a common current sensor using Hall elements. The factor $K_{ADJ}$ represents the gain of the overall system and has the physical unit of a transimpedance (V/A, volts per ampere).

The low-pass 25, the weight-factors 26 and 34, as well as the adder 40 are inter alia components of an evaluation circuit 200. The evaluation circuit of FIG. 1 is to be understood solely as an example. The essential function of the evaluation circuit is the combination of the first signal $U_T$ dependent on the measurement current $I_P$ with the second signal $U_H$ dependent on the measurement current $I_P$ to one output signal $U_{OUT}$, that is a combination of information obtained by different measurement principles.

FIGS. 2 and 3 show one possible realization of the measurement circuit of FIG. 1 on one semiconductor substrate. FIG. 2 shows the top view of an exemplary sensor arrangement while FIG. 3 shows a cross-sectional view of the same sensor arrangement. In the semiconductor body 100, for example a doped silicon semiconductor body, one or more Hall sensors 30 are integrated. The circuit of FIG. 1 only makes use of a single Hall sensor 30. An alternative circuit with a Hall sensor 300 comprising four single sensor elements 30, 31, 32, 33 is described below with reference to FIG. 4. The sensor elements 30, 31, 32, 33 of the Hall sensor 300 are arranged in or on the semiconductor substrate 100 such, that they are pervaded by the magnetic field of a planar coil which is spaced apart in a vertical direction from the surface of the substrate 100. In the present case the Hall sensor elements 30 to 33 are sensitive to a magnetic field component parallel to the surface of the semiconductor body, i.e., sensitive to horizontal magnetic field components. An isolation layer 111, for example a layer of silicon oxide, is arranged on the surface of the semiconductor body 100. A metallization layer 112 is arranged on the isolation layer 111, the metallization layer 112 comprising a planar coil 20 which corresponds to the secondary winding of FIG. 1. A further isolation layer is arranged in a vertical direction above the first planar coil. On this further isolation layer a second planar coil 10 is arranged, which corresponds to the primary winding of FIG. 1. The order of the layers which the first planar coil 20 and the second planar coil 10 are arranged in is irrelevant for the function of the measurement circuit of FIG. 1. However, it is important that the first and the second planar coil 20 and 10 are coupled magnetically and that the magnetic field of the second planar coil (primary winding 10) generated by the measurement current $I_P$ pervades the Hall sensors in their sensitive direction. One of the two planar coils may be arranged on the upper surface, whereas the other planar coil may be arranged on the bottom surface of the substrate 100. The second planar coil 10 is depicted in the form of a spiral in FIG. 2. However, other geometric arrangements are possible, for example, the arrangement of the conducting paths of the planar coils along the edges of a rectangle.

The above described arrangement of FIGS. 2 and 3 is well-suited for the integration of Hall sensors, planar coils, and evaluation circuits in one single chip, the Hall sensors being integrated in or arranged on the semiconductor substrate 100 below (in a vertical direction) the planar coils. The terminals +$I_P$ and −$I_P$ shown in FIG. 2 form the terminals of the primary winding 10 which is fully galvanically isolated from the other circuit components. The terminals with the reference symbol $V_{CC}$ and GND are the supply terminals for the Hall sensors and the other circuit components connected to the secondary winding of the planar transformer (10, 20).

The terminal $U_{CTRL}$ may be a digital port for exchanging digital measurement and control data. The measurement signal $U_{OUT}$ can be provided at an output terminal.

Figure 4:
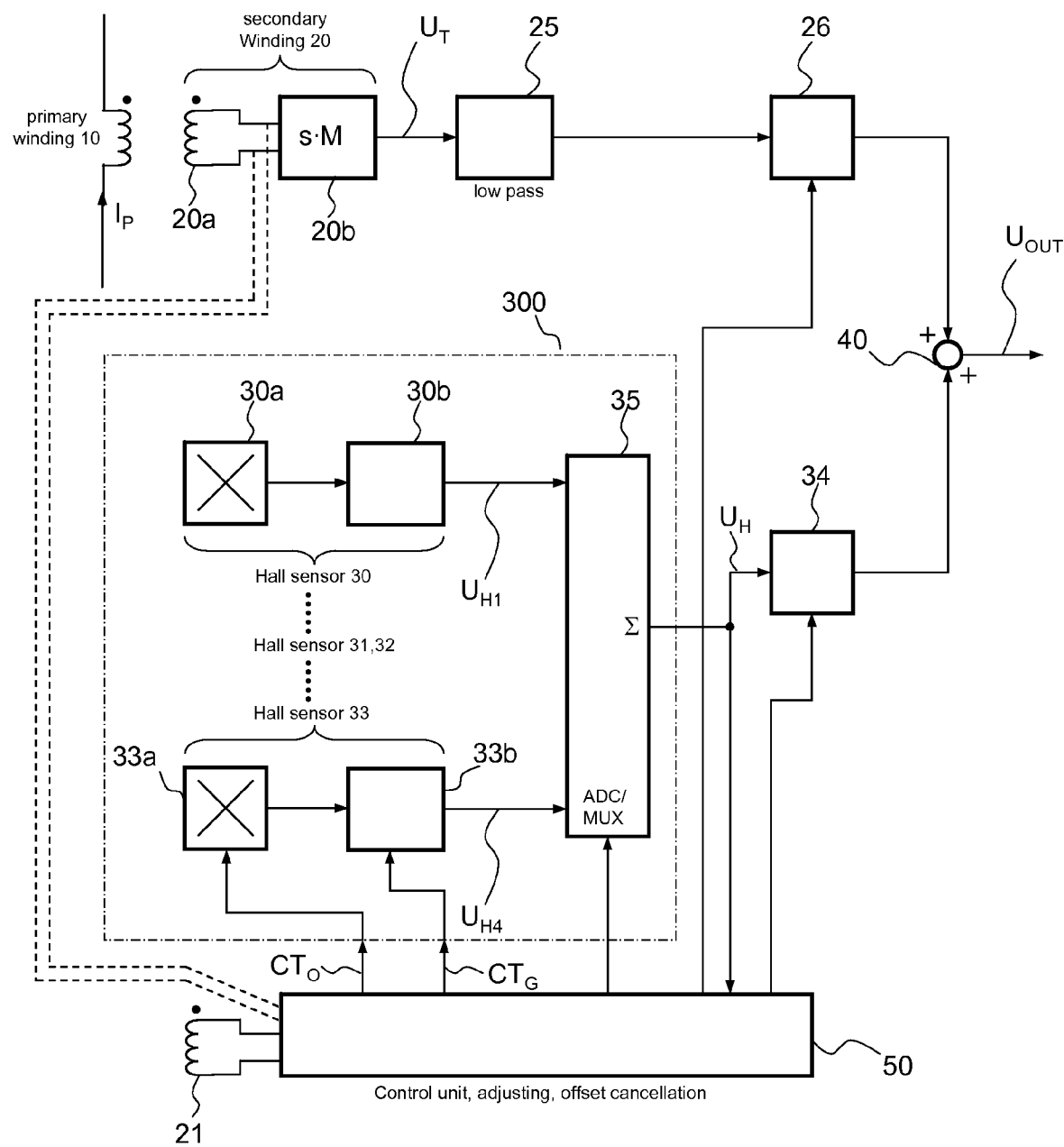
FIG. 4 shows a self-calibrating measurement circuit for a potential separated current measurement as a further example of the invention.

FIG. 4 depicts a further example of the invention, i.e., a current measurement circuit which operates following the same principle as the measurement circuit of FIG. 1, wherein the circuit of FIG. 4 allows for a self-calibration of the measurement circuit.

Like the measurement circuit of FIG. 1, the measurement circuit of FIG. 4 comprises the primary winding 10, a secondary winding 20, a low-pass 25, a Hall sensor 300, weight factors 26, 34 and an adder 40 for a weighted summation of the low-pass filtered output signal of the secondary winding (third signal $U_T$) and the output signal of the Hall sensor (second signal $U_H$). The circuit further comprises a further winding 21 which is connected to a control circuit 50 for calibrating the measurement circuit. The control circuit 50 can, for example, be a micro controller.

A calibration of the measurement circuit may, for example, be performed once after switching on the power supply or can be performed repeatedly, for example, after a defined time span has elapsed since the latest calibration. A predefined current is injected into the further winding 21 by the control circuit 50. The further winding 21 is also arranged on the substrate 100 described above such that the magnetic field of the further winding 21 penetrates the Hall sensors in their sensitive direction. The further winding 21 is also realized as a planar coil and isolated from the other planar coils.

Calibration is performed under the assumption that the measurement current $I_P$ through the primary winding 10 equals zero. In this case the output signal $U_H$ of the Hall sensor 300 is only dependent on the current flowing trough the further winding 21. This output signal is also provided to the control circuit 50. Since the control circuit 50 "knows" the current through the further winding 21 and the resulting output signal $U_H$ of the Hall sensor, the control circuit 50 is able to calculate an offset error and a gain error of the Hall sensor 300. The gain of the Hall sensor is defined as the change of the output voltage (second signal $U_H$) over the measurement current $I_P$. This expression is also referred to as sensitivity.

A calibration can also be done without the further winding 21. In this case the secondary winding 20 is connected to the control circuit 50 during the calibration (cf. dotted line in FIG. 4). A known test current is injected to the secondary winding 20 by the control circuit 50. The adaption of the offset and the gain of the Hall sensor 300 can then take place as described above. The secondary winding thereby takes over the function of the further winding 21. After the calibration the secondary winding is reconnected with the low-pass 25, it can be resumed with normal measurement operation.

The gain and the offset of the Hall sensors can be programmable, i.e., adjustable. The Hall sensor 300 therefore comprises inputs for receiving respective control signals $CT_G$ and $CT_O$. The gain and the offset of the Hall sensors can be adjusted according to the control signals $CT_G$ and $CT_O$. During a "normal" measurement operation the further winding 21 carries no current and does not influence the measurement operation.

The Hall sensor of FIG. 1 only comprises a single sensor element 30. However, the measurement circuit can be provided with Hall sensors comprising several single sensor elements. The Hall sensor 300 of FIG. 4 comprises four single sensor elements 30, 31, 32, 33. The four sensor elements, for example, can be arranged in pairs, as depicted in FIGS. 2 and 3 for compensating for parasitic effects as the effects of external magnetic fields or changes in temperature. The output signals $U_{H1}$, $U_{H2}$, $U_{H3}$, $U_{H4}$ of the single sensor elements can be provided to the control circuit 50. The control circuit 50 is able to calculate the offset-error and the gain-error of each single sensor elements and to adjust the offset and the gain values of each sensor element 30 to 33 by means of the control signals ($CT_O$, $CT_G$) such that the offset of each sensor equals zero and the gain of each sensor equals a desired gain.

The Hall sensor 300 has a control unit 35 which may comprise an analog-to-digital-converter, a multiplexer which is adapted for combining (multiplexing) the output signals $U_{H1}$, $U_{H2}$, $U_{H3}$, $U_{H4}$ of the single sensor elements to one signal. The control unit 35 of the Hall sensor can, partially or as a whole, be a component of the control circuit 50. For example, the control circuit 50 may be a microcontroller with an integrated analog-to-digital-converter. In this case, the control unit 35 does not need an extra analog-to-digital-converter.

The control unit 35 of the Hall sensor 300 is, for example, adapted for combining the output signals of the single sensor elements 30 to 33 to a single output signal of the Hall sensor 300 (i.e. the second signal $U_H$). This combining may be a weighted addition to the output signals $U_{H1}$ to $U_{H4}$ of the single sensor elements 30 to 33. If four sensor elements 30 to 33 are arranged as depicted in FIGS. 2 and 3, an addition of the output voltages $U_{H1}$ to $U_{H4}$ results in a compensation of the effects of an external magnetic field and the compensation of the effects of a temperature drift and the piezoelectric effect.

An additional temperature sensor (not shown) may be connected to the control circuit 50 for measuring a possible change in temperature and for compensating for the resulting drift of the offset and/or of the gain of the single sensor elements 30 to 33 via adjusting the offset and the gain by means of the control signals $CT_O$ and $CT_G$. The weighted addition of the adder 40 and the weight factors 25 and 34 can also be performed by the control circuit 50. This may especially be desirable if a microcontroller is employed as control circuit 50. In this case the functional blocks 26, 34 and 40 can be implemented fully digitally in a microcontroller. An external control signal $U_{TRL}$ received by the control circuit 50 may be used to trigger a calibration operation and/or a measurement operation.

What is claimed is:

1. A sensor arrangement comprising:
   a substrate;
   a first coil spaced apart from a surface of the substrate in a vertical direction, wherein the first coil comprises a primary winding for carrying a primary current generating a magnetic field;
   a second coil spaced apart in the vertical direction from the first coil, wherein the second coil comprises a secondary winding magnetically coupled with the primary winding and providing a first signal dependent on the primary current;
   at least one Hall element integrated in or arranged on the substrate, wherein the Hall element is arranged such that it is pervaded by the magnetic field of the primary current for providing a second signal depending on the primary current;
   an isolation layer arranged between the first coil and the second coil; and
   an evaluation circuit for determining a measurement signal representing the primary current from a first signal and a second signal.

2. The sensor arrangement of claim 1, wherein the first and the second coils comprise planar coils.

3. The sensor arrangement of claim 2, further comprising a further coil that is also arranged on the substrate and spaced apart in the vertical direction from the first coil.

4. The sensor arrangement of claim 1, further comprising a control circuit integrated in the substrate.

5. The sensor arrangement of claim 1, further comprising a digital processor for digital signal processing, the digital processor being integrated in the substrate.

6. The sensor arrangement of claim 1, wherein the substrate comprises a silicon semiconductor body.

7. The sensor arrangement of claim 1, wherein the at least one Hall element comprises only one Hall element.

8. The sensor arrangement of claim 1, wherein the first coil overlies the at least one Hall element.

9. The sensor arrangement of claim 1, wherein the first coil has twice as many windings as the second coil.

10. The sensor arrangement of claim 1, wherein the evaluation circuit comprises:
    a low-pass receiving the first signal and providing a third signal that is a low-pass-filtered version of the first signal; and
    an adder for a weighted addition of the second signal and the third signal for providing a measurement signal that is dependent on the weighted addition.

11. The sensor arrangement of claim 1, wherein the Hall element can be calibrated in terms of offset and/or gain.

12. The sensor arrangement of claim 11, further comprising:
    a further winding generating a magnetic field and arranged such that the magnetic field of the further winding pervades the Hall element; and
    a control circuit receiving an output signal of the Hall element.

13. The sensor arrangement of claim 12, wherein the control circuit is adapted to inject a defined current signal into the further winding and to calibrate the Hall element using the current signal and the output signal of the Hall element.

14. The sensor arrangement of claim 1, wherein the Hall element comprises several single sensor elements, each single sensor element providing an output voltage.

15. The sensor arrangement of claim 14, wherein the Hall element comprises a control unit adapted for combining output voltages of the single sensor elements to one output signal of the Hall element.

16. The sensor arrangement of claim 1, wherein a low-pass and an adder are implemented digitally and the measurement signal is provided as a digital word.

17. The sensor arrangement of claim 1, wherein a control circuit receives a control signal for triggering a calibration operation or a measuring operation.

18. A sensor arrangement comprising:
    a substrate;
    at least one magnetic sensor element integrated in or arranged on the substrate;
    a first coil spaced apart from a surface of the substrate in a vertical direction, the first coil comprising a primary winding for carrying a primary current generating a magnetic field;
    a second coil spaced apart in the vertical direction from the first coil, the second coil comprising a secondary winding magnetically coupled with the primary winding and providing a first signal dependent on the primary current, wherein the magnetic sensor element is arranged such that it is pervaded by the magnetic field of the primary current for providing a second signal depending on the primary current;
    an isolation layer arranged between the first coil and the second coil; and
    an evaluation circuit for determining a measurement signal representing the primary current from the first signal and the second signal.

19. The sensor arrangement of claim 18, wherein the evaluation circuit comprises:
    a low-pass receiving the first signal and providing a third signal that is a low-pass-filtered version of the first signal; and
    an adder for a weighted addition of the second signal and the third signal for providing a measurement signal that is dependent on the weighted addition.

20. The sensor arrangement of claim 18, wherein the magnetic sensor element can be calibrated in terms of offset and/or gain.

21. The sensor arrangement of claim 20, further comprising:
    a further winding generating a magnetic field and arranged such that the magnetic field of the further winding pervades the magnetic sensor element; and
    a control circuit receiving an output signal of the magnetic sensor element.

22. The sensor arrangement of claim 21, wherein the control circuit is adapted to inject a defined current signal into the further winding and to calibrate the magnetic sensor element using the current signal and the output signal of the magnetic sensor element.

23. The sensor arrangement of claim 18, wherein the magnetic sensor element comprises several single sensor elements, each single sensor element providing an output voltage.

24. The sensor arrangement of claim 23, wherein the magnetic sensor element comprises a control unit adapted for combining output voltages of the single sensor elements to one output signal of the magnetic sensor element.

25. The sensor arrangement of claim 19, wherein the low-pass and the adder are implemented digitally and the measurement signal is provided as a digital word.

26. The sensor arrangement of claim 18, wherein a control circuit receives a control signal for triggering a calibration operation or a measuring operation.

27. The sensor arrangement of claim 18, wherein the magnetic sensor element comprises a Hall element.

* * * * *